US010810344B1

(12) United States Patent
Liang et al.

(10) Patent No.: US 10,810,344 B1
(45) Date of Patent: Oct. 20, 2020

(54) MULTI-INSTANTIATION TIME BUDGETING FOR INTEGRATED CIRCUIT DESIGN AND MANUFACTURING

(71) Applicants: Hongchang Liang, Austin, TX (US); Jian Tang, Austin, TX (US); Yizhou Lin, Santa Clara, CA (US)

(72) Inventors: Hongchang Liang, Austin, TX (US); Jian Tang, Austin, TX (US); Yizhou Lin, Santa Clara, CA (US)

( * ) Notice: Subject to any disclaimer, the term of this patent is extended or adjusted under 35 U.S.C. 154(b) by 0 days.

(21) Appl. No.: 16/370,008

(22) Filed: Mar. 29, 2019

(51) Int. Cl.
*G06F 30/398* (2020.01)
*G06F 16/901* (2019.01)
*G06F 30/392* (2020.01)

(52) U.S. Cl.
CPC ........ *G06F 30/398* (2020.01); *G06F 16/9024* (2019.01); *G06F 30/392* (2020.01)

(58) Field of Classification Search
USPC ........................................................ 716/134
See application file for complete search history.

(56) References Cited

U.S. PATENT DOCUMENTS

| 2007/0033561 | A1* | 2/2007 | Jones | G06F 17/5031 716/107 |
| 2008/0209181 | A1* | 8/2008 | Petkov | G06F 17/505 712/220 |
| 2010/0131912 | A1* | 5/2010 | Ispir | G06F 17/5045 716/118 |

\* cited by examiner

*Primary Examiner* — Eric D Lee
(74) *Attorney, Agent, or Firm* — Oliff PLC

(57) ABSTRACT

A method of time budgeting an integrated circuit (IC) including acquiring a graph data structure and clock cycle requirements, where the graph data structure includes at least two identical blocks of a plurality of blocks that correspond to an identical design module. The method acquires internal and external delay values ports of each design module, and sets parameters, which include the internal and external delay values of the at least two identical blocks as equivalent for the identical blocks. The method performs optimization of the parameters of the ports of all of the blocks, and determines whether the optimized parameters of each of the ports satisfy predetermined requirements of the IC. The method outputs a final design of the IC design based on results of the optimization for manufacturing of the IC based on the final design.

9 Claims, 5 Drawing Sheets

MULTI-INSTANTIATION TIME BUDGETING FOR INTEGRATED CIRCUIT DESIGN AND MANUFACTURING

BACKGROUND

The exemplary embodiments generally relate to multi-instantiation time budgeting for components of a semiconductor integrated circuit (IC) in the design and manufacturing of the IC.

An IC includes a large number of electronic components that are manufactured on a substrate by forming layers of different materials and of different geometric shapes. The design of ICs continues to evolve, which increases the complexity and time required for design and manufacturing of ICs. Further, manufacturing technology continues to decrease the size of components, which allows a larger number of functions to be incorporated on a single IC. IC designers are capable of creating systems of components on an IC that are increasingly more complex, robust, and require a high-level design language in order to construct, verify, and test the IC.

Electronic design automation (EDA) systems are software used to aid a designer in design of an IC. For complex ICs, the physical layout and design of an IC is divided into multiple functional blocks with a plurality of levels of hierarchy, and each of the blocks may correspond to the same design module or different design modules. A design module is a functional partition of a full IC design that describes a function of the block according to the electronic components installed in the block. For example, an EDA system may receive descriptions and parameters of the IC device defining interconnections of nodes and components on the IC, and includes multiple types of physical information of circuit components. Time budgeting derives input and output delay constraints along with path exceptions for the timing closure of the blocks or partitions, enabling the timing closure of all the blocks simultaneously.

An integrated circuit designer may use the EDA system to create a physical integrated circuit design layout from a logical circuit design of the IC. The EDA system uses geometric shapes of different materials to design a layout of the various electrical components on a substrate. Upon creating an initial integrated circuit layout, a designer then analyzes and optimizes the IC layout using the EDA system. One function of an EDA system is to determine whether the IC design meets timing requirements along signal paths in the design. Failure of a design to adequately meet timing requirements could result in the IC failing during use and/or not properly functioning for its intended purpose. Thus, for design purposes, it is important for designers to be able to accurately confirm that an IC design will satisfy its timing requirements.

Time budgets are defined for each data path at each port of a block on the IC. A time budget derives a timing constraint of a block from the timing constraint of the full IC design. Time budgeting is a necessary step for large IC design, which uses algorithms to distribute timing period requirements to each input port and output port of each block of the IC.

There are prior methods for performing time budgeting. A first example of prior methods for performing time budgeting was to convert the full chip design into a directed acyclic graph (DAG), and use algorithms to determine a timing specification for the input and output ports of each block in the IC design. The timing specifications of the blocks are different from each other, and thus require the implementation of each timing specification for each block to be different from each other.

A second example of prior methods for performing time budgeting was to specify the time budget in a bottom-up method. The designer assigned a timing specification depending on their expert knowledge or known timing specifications of a particular design module, instead of using the full IC design's timing specification. When the physical layout of the blocks is unable to meet their block timing constraints in a full IC, the designer resolves these issues by manually re-allocating the block timing constraints.

However, as the complexity of designing integrated circuits continues to increase, there is the need to improve the efficiency and accuracy of the time budgeting of the design and manufacturing of integrated circuits.

SUMMARY

The exemplary embodiments provide a method of time budgeting of a multi-instantiation IC that is divided into multiple blocks, where at least two of the blocks include the same design module of components. The exemplary embodiments distribute an equal amount of time budgeting to blocks of the same design modules, while still achieving the full IC timing specifications. Therefore, time budgeting for multiple blocks of an IC with the same design module is performed together for the multiple blocks with the same design module, which reduces the engineer workloads and computational resource machine (computer) requirements, increases the speed and efficiency of the design process, and results in a final design of the IC chip where blocks with identical design modules have the same final time budgeted design. The same time budgeting of blocks also results in the same physical design of the components of the blocks when manufactured. Thus, the design process of the exemplary embodiments also changes the physical implementation of the blocks when the IC is manufactured.

In the first example of the prior methods, the time budgeting of each block was different from each other despite multiple blocks having the same design module. This prior method performed time budgeting for each block individually from each other. Because time budgeting affects the physical layout of a manufactured IC, when a different time budget is set for identical design modules and blocks, the physical implementation requires different optimization resulting in a different final design of the elements that connect to the input and output ports of the IC.

According to this prior method, a design module that appears "n" times in the full IC design will need "n" different physical implementations. This time-consuming process may have been previously permitted for smaller and less complex IC, when there was no extensive use of the same design module. However, this time-consuming approach is now burdensome and a waste of engineering and computational resources for current and future ICs having a design module that could be reused from several or hundreds of times in a single IC in modern and future designs.

In the second example of prior methods, the timing specification is calculated based on each design module, instead of the full IC timing specification. Although the timing specification only needs to be performed for one implementation for each design module, the implementation considers the design module only.

As a similar example, the conventional technique calculates the time budget for each block separately, which results in different values of internal and external delays for different blocks. Therefore, conventional designers have to create physical implementations of each block individually, which could require tremendous engineering work. An alternative conventional technique, a designer could pick one of the delay values to implement to identical design modules, which may result bad timing of the timing paths in the other block. This would then result in the designers needing to fix the timing paths iteratively with several rounds of design and fix. As another example, if the workload is too high, the designer could use prior experiences to set the delay values, which could also cause bad designs, and/or burdensome iterations to fix adjacent blocks.

However, these prior methods required an excessive amount of time and processing resources, especially as the number of components and features increases in modern electronic devices.

In order to solve these problems in the prior methods, the exemplary embodiments distribute equal time budgeting to blocks of the same design modules, while still achieving the full IC timing specifications. For example, the exemplary embodiments set identical time budgeting to all blocks of the same design, and then determine a time budgeting for the set blocks of the same design module together, instead of individually as in the conventional techniques.

Time budgeting methods distribute timing delays relative to the different input and output ports of each block. As IC design progresses and becomes more complex in current electronic devices, there could be several blocks in the full IC that have the same design to each other, i.e., blocks of the same design module. Under the conventional budgeting methods, these blocks have separate time budgeting distribution according to different algorithms, and engineers need to optimize these blocks one-by-one. The exemplary embodiments improve the conventional methods by determining equal time budgeting to blocks of the same design modules, while still achieving the full IC timing specifications.

The exemplary embodiments provide improved time budgeting by performing time budgeting for multiple blocks with the same design module together, instead of individually, such that the time budgeting for the multiple blocks having the same design module are determined to be identical to each other. This improved time budgeting reduces the engineer and computational resource (computer) requirements for physical designs, increases the speed and efficiency of the design process, and results in a final design of the IC chip where blocks with identical design modules have the same final time budgeted design (and manufactured layout).

DETAILED DESCRIPTION

Figure 1:
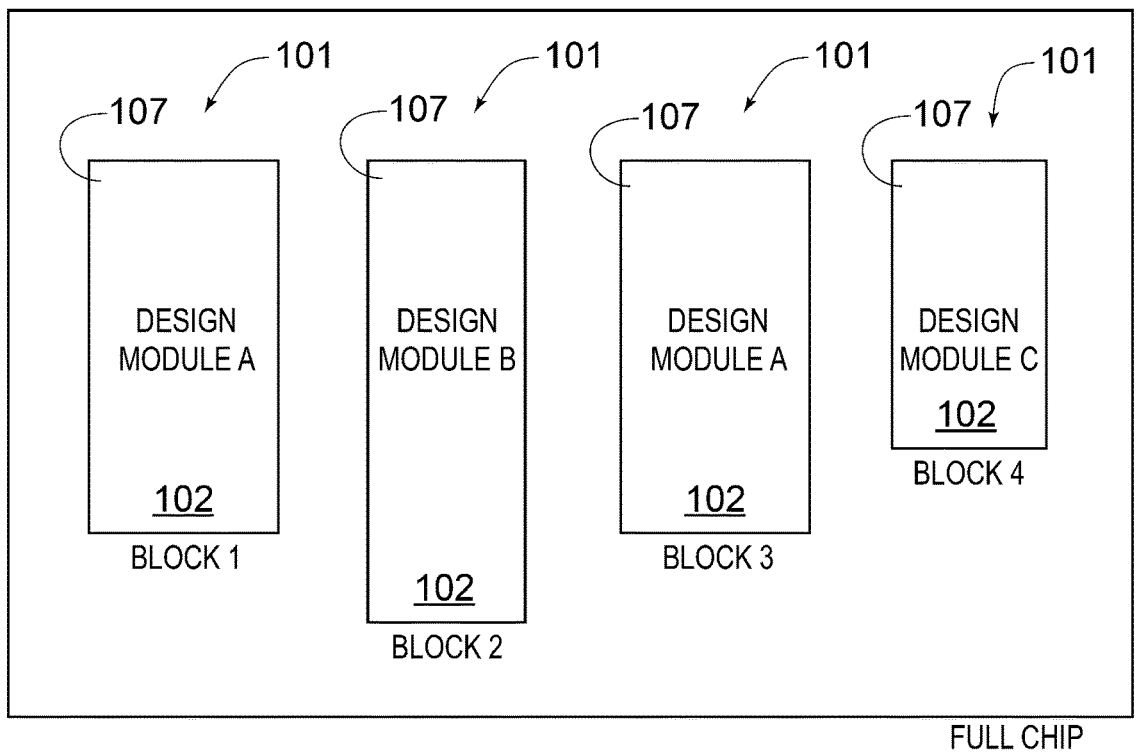
FIG. 1 illustrates a full IC having four blocks where two of the blocks have the same design module according to an exemplary embodiment.

The exemplary embodiments relate to time budgeting of clock signal timing of IC design. FIG. 1 is a block diagram illustrating a full integrated circuit (IC) 100 that is partitioned into, for example, four functional blocks 101 of electronic components (not shown). The blocks 101 partitioning the IC 100 into different regions perform functions according to the electronic components within each block 101. Each block 101 is a physical instantiation of a design module 102 in the full IC 100.

The exemplary embodiments are directed to budgeting of clock signal timing of IC design for time budgeting of the blocks 101 of the IC 100 in order to satisfy a predetermined time budget. Time budgeting divides the time for a data signal to propagate along the data path extending between different blocks 101 of the IC 100. Clock budget timing may be based on timing models for the different blocks 101 and/or the full IC 100. The exemplary embodiments provide improved time budgeting by performing time budgeting for multiple blocks 101 with the same design module 102 together, instead of individually, such that the time budgeting for the multiple blocks 101 having the same design module 102 are determined to be identical to each other. As discussed in further detail herein, this improved time budgeting reduces computational requirements of the EDA, increases the speed and efficiency of the design process, and results in a final design of the IC chip where blocks with identical design modules have the same final time budgeted design (and manufactured layout).

Time budgeting is a part of the block implementation in the design of the IC 100 that allows for generating of timing and physical constraints for each partition (e.g., design module, block, etc.).

The exemplary embodiments are used to design an integrated circuit, such as IC 100. IC 100 may be depicted in multiple different manners, such as a flattened chip or a tree hierarchy of different levels of circuits. For example, FIG. 1 shows the IC 100 as a flattened chip for illustrative purposes.

FIG. 1 is a block diagram illustrating the IC 100 that is partitioned into the four functional blocks 101 of electronic components. Each block 101 is a physical instantiation of a design module 102 in the full IC 100. The design module 102 is a functional partition of the IC 100. The design module defines the function behavior of the electronic components within the block 101. The design module 102 may have one or multiple physical realizations in the IC. In other words, the full IC 100 may have multiple design modules 102 that are identical.

For example, as illustrated in FIG. 1, two of the blocks 101 (Block 1 and Block 3) have the same design module (Design Module A). Design Module A defines the functional behavior of Block 1 and Block 3, which is different than the functional behavior defined by Design Module B and Design Module C. Design Module B and Design Module C respectively define Block 2 and Block 4.

Figure 2:
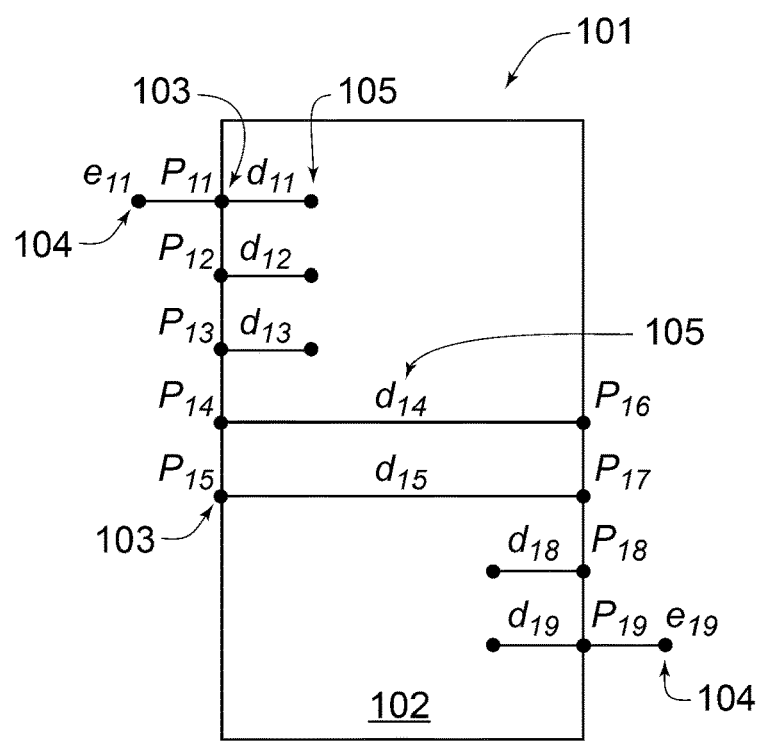
FIG. 2 illustrates an example of a block of the IC with internal and external delays of ports of the IC according to an exemplary embodiment.
Figure 3:
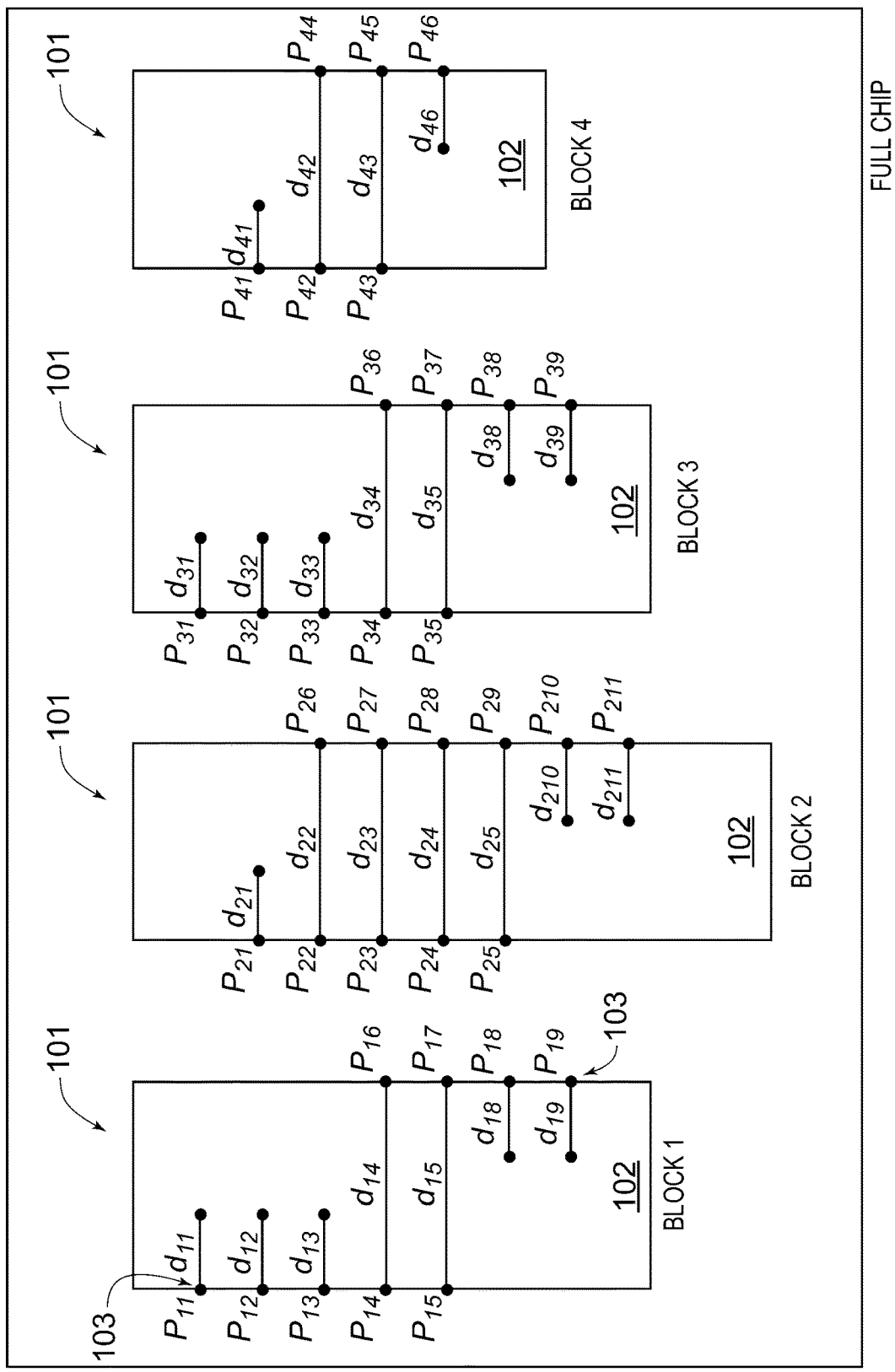
FIG. 3 illustrates internal and external delays of ports of each block of the full IC of FIG. 1 according to an exemplary embodiment.

Each block 101 is defined by one or more ports 103 ($P_{11}$-$P_{19}$, $P_{21}$-$P_{29}$, $P_{210}$, $P_{211}$, $P_{31\text{-}39}$, and $P_{41}$-$P_{46}$), as shown in FIGS. 2 and 3. For example, the ports 103 are located on a first side as input ports to receive incoming data signals to the block 101, and on a second side as output ports where the outgoing data signals are transmitted from each block 101. The ports 103 have connected elements 107 that are initially located at specified positions relative to the ports 3 of each block 101. During optimization of the time budgeting, which is discussed in more detail below, the position of one or more of the connected elements 107 may be moved relative to a respective one of the ports 103 depending on a change in the time budgeting. The location of each port 103 and connected element 107 in a final design of the IC 100 identifies the physical location of each port 103 and connected element 107 on the IC 100 when manufactured using an integrated circuit manufacturing and/or fabrication tool(s).

For clock time budgeting, a total clock delay of the IC 100 at a top level of hierarchy is divided between the blocks 101 in parallel with the data time budgeting of the data signal paths. The total clock delay of the IC 100 is specified as either an external clock delay 104 or an internal clock delay 105 of each block 101.

Figure 4:
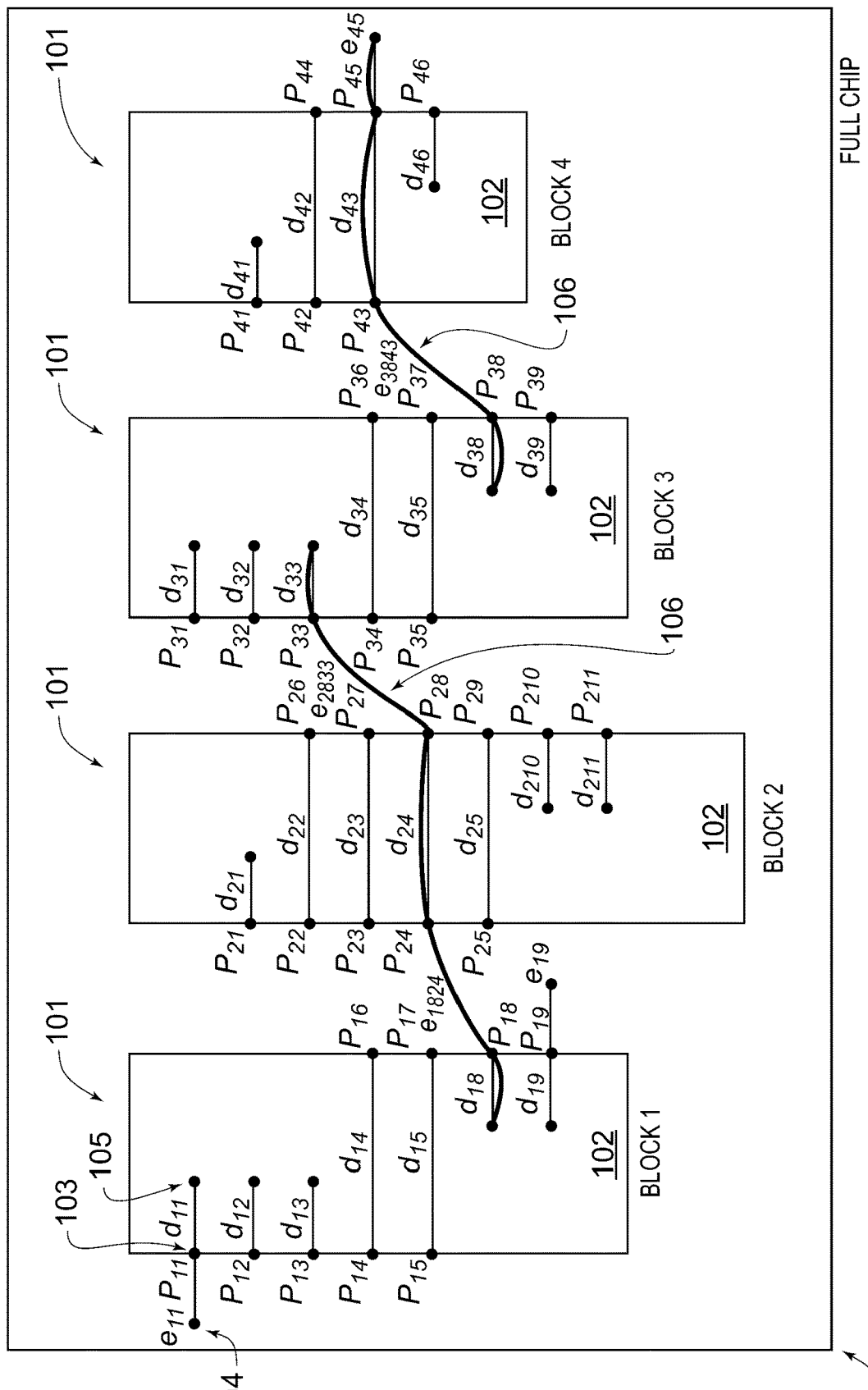
FIG. 4 illustrates timing relationships along timing paths between the blocks of the full IC according to an exemplary embodiment.

As shown in FIGS. 2-4, external delays 104 ($e_{11}$, $e_{1824}$, $e_{2833}$, $e_{3843}$, and $e_{45}$) are set for delays outside of each block 101, and internal delays 105 ($d_{11}$-$d_{19}$, $d_{21}$-$d_{25}$, $d_{210}$, $d_{211}$, $d_{31}$-$d_{35}$, $d_{38}$, $d_{39}$, $d_{41}$-$d_{43}$, and $d_{46}$) are set for delays for components within each of the blocks 101. In other words, external delays 104 are the segments outside of all blocks 103, which are values that are given from the "top" design. Internal delays 105 are the segments "inside" each block 101, and are values that are optimized by the optimization of the time budgeting.

As shown in FIG. 4, a timing path 106 connects between different blocks 101 of the IC 100. The timing paths 106 indicate the data signals that propagate between the ports of the different blocks 101. The timing paths 106 may be configured to connect between varieties of different blocks 101 depending on the configuration of electronic components on the IC 100.

For example, as shown in FIG. 4, a first timing path 106 extending from Block 1 to Block 2 to Block 3 indicates data signals propagating from within Block 1, accounting for internal delay $d_{18}$, port $P_{18}$, external delay $e_{1824}$, port $P_{24}$ internal delay $d_{24}$, port $P_{28}$, external delay $e_{2833}$, port $P_{33}$, and internal delay $d_{33}$. Further, a second timing path 106 extends from Block 3 to Block 4, which indicates data signals propagating from within Block 3, accounting for internal delay $d_{38}$, port $P_{38}$, $e_{3843}$, port $P_{43}$, internal delay $d_{43}$, port $P_{45}$, and $e_{45}$.

A clock cycle of the IC 100 must be set to be equal to or larger than all of the timing paths 106 in order for the IC 100 to function properly, where the data signals have sufficient time to propagate through the IC 100. Similarly, a clock cycle for each block 101 must be set equal to or larger than the time necessary for a data signal to propagate along a timing path 106 extending through the respective block 101. Thus, it is important to optimize the time budgeting of the blocks 101 of the IC 100 in order to ensure proper functioning of the IC 100.

Method of Time Budgeting an Integrated Circuit (IC)

Figure 5:
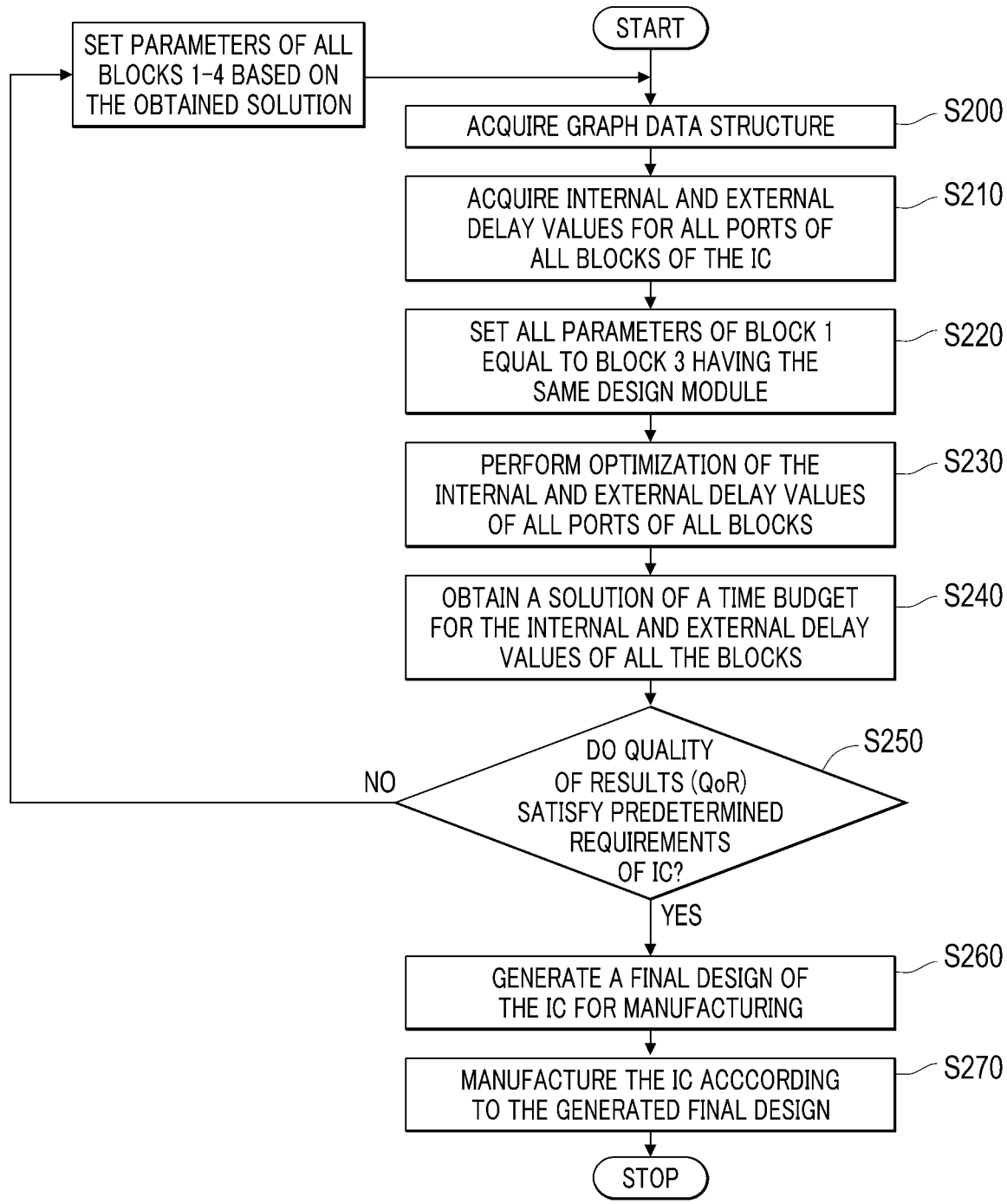
FIG. 5 illustrates a flowchart of exemplary processes for multi-instantiation time budgeting according to an exemplary embodiment.

FIG. 5 illustrates a flowchart explaining exemplary steps of a method of time budgeting IC 100. The method may include fewer or additional steps than the exemplary embodiments set forth herein.

In step S200, a graph data structure of an IC design for IC 100 is acquired based on an initial physical database of the electronic components of the IC 100. FIG. 3 illustrates an example of the graph data structure. The graph data structure divides electronic components of the IC design into the plurality of blocks 101. Each of the plurality of blocks 101 corresponding to one of the design modules 102. At least two blocks 101 (e.g., Block 1 and Block 3) correspond to an identical design module 102.

The graph data structure indicates an initial layout of ports 103 ($P_{11}$-$P_{19}$, $P_{21}$-$P_{29}$, $P_{210}$, $P_{211}$, $P_{31-39}$, and $P_{41}$-$P_{46}$) of each block 101 (Block 1, Block 2, Block 3, and Block 4). The graph data structure also indicates external delays 104 and internal delays 105 for each port 103.

In step S210, values of the internal delay 105 and values of the external delay 104 of the plurality of ports 103 of each design module 103 are acquired and initially set corresponding to the plurality of blocks 101. The values of the internal delay 105 and values of the external delay 104 are time delays that are caused by a data signal propagating between ports 103.

In step S210 through step S230, optimization of the values of the internal delay 105 and the values of the external delay 104 is performed to satisfy a predetermined clock cycle of the IC 100. Optimization refers to a quantitative computer algorithm or method that is applied to find a feasible solution to time budgeting. For example, the algorithms may be linear optimization which may also be referred to as linear programming. Since the relationships between the internal delays 105 and the externals delays 104, and the clock period of the clock cycle is a linear relationship, it is practical to use linear optimization or linear programming to calculate a solution for the variables.

Time budgeting algorithms distribute timing requirements for the external delays 104 and internal delays 105 relative to each port 103 of the IC 100. The timing requirement could be in various formats, such as one clock period, half of a clock period, or multiple clock periods. As integrated circuit technology progresses, there could be several blocks 101 in the full chip which have the same composition of electronic components to each other, i.e., blocks 101 of the same design module 102.

In step 220, these blocks 101 that have the same design module 102 are set as equivalent to each other such that when optimization of the external delays 104 and the internal delays 105 is performed in step S230, as discussed below, the calculated time budgeting of the internal delays 105 are identical for each block 101 having the same design module 102 in the IC 100. By setting the blocks 101 having the same design module 102 as equivalent, the method implements the multi-instantiation of these blocks 101 having the same design 102 during the optimization to reduce the computational requirements of the optimization of the full IC 100 and maintains the time budgeting as identical for these blocks 101 having the same design module 102, as an improvement over the conventional techniques.

Under the conventional time budgeting, Blocks 1-4 of FIG. 1 would have been assigned separate time budgeting distribution according to different algorithms, and engineers were required to optimize Blocks 1-4 one-by-one. However, the exemplary embodiments distribute an equal amount of time budgeting to blocks 101 of the same design modules 102 (i.e., Block 1 and Block 3), while still achieving the clock cycle requirements of the full IC 100. Therefore, there is a need to only optimize identical blocks (Block 1 and Block 3) once, instead of separately as inefficiently performed in the conventional art.

In step S230, optimization of the values of the internal delay 105 and the values of the external delay 104 is performed to determine a solution that satisfies the predetermined clock cycle of the IC 100. The optimization is performed on each of the blocks 101 having a different design module 102. Meaning, in the example shown in FIGS. 3 and 4, the optimization is performed on Block 1 and Block 3 together because both Block 1 and Block 3 have the same design module 102 (Design Module A), as shown in FIG. 1. The optimization is also performed on each of Block 2 and Block 4 in addition to the optimization performed on the combination of Block 1 and Block 4.

The optimization modifies a physical location of at least one of the connected elements 107 of ports 103 in order to satisfy the acquired clock cycle requirements.

In the optimization, all delay variables/values 104/105 along each timing path 106 are summed together, and the sum must be equal to or less than the clock period of each timing path 106. Using the timing paths 106 in FIG. 4 as examples, assume for this example that the timing paths 106 are all under one clock cycle. The following relationships for the internal and external delays are set as requirements:

$e_{11}+d_{11} \leq$ Clock period $d_{19}+e_{19} \leq$ Clock period $d_{18}+e_{1824}+d_{24}+e_{2833}+d_{33} \leq$ Clock period $d_{38}+e_{3843}+d_{43}+e_{45} \leq$ Clock period In addition, step S220 requires setting the equivalence between the parameters of the blocks 101 of the same design module 102. Because Block 1 and Block 3 each have the same design module 102 (Design Module A), the following equivalence requirements are set to represent the relationship between blocks of the same design module 102:

$d_{11}=d_{31}$ $d_{12}=d_{32}$ $d_{13}=d_{33}$ $d_{14}=d_{34}$ $d_{15}=d_{35}$ $d_{18}=d_{38}$ $d_{19}=d_{39}$

In step S240, a solution for the time budget of all of the internal delays 105 and the external delays 104 is obtained as a result of the optimization performed on the IC 100. The solution at least indicates values of each $d_{ij}$ value and $e_{ij}$ value that result in a time budget equal to or less than the clock period requirement along each timing path 106.

In the solution, the values of the internal delays 105 for Block 1 and Block 3 are identical due to the multi-instantiation of Block 1 and Block 3, which have the same design module 102, by setting the parameters of Block 1 and Block 3 as identical to each other and performing the optimization of Block 1 and Block 3 together.

In step S250, a Quality of Results (QoR) determination is performed. After calculating a set of input and output timing delay variables, i.e. $d_{ij}$, $e_{ij}$ etc., the variables to guide a physical implementation process. Based on information derived from the variables, with adjusted configurations, an initial version of a physical database is generated. Different EDA tools may be used to verify different aspects of the physical database, and quality of results (QoR) are evaluated to examine whether the physical database is satisfies all design and manufacturing criteria.

When the QoR do not satisfy the predetermined clock cycle requirements of the IC 100, then the method returns to step S200 and iteratively performs steps S200 to S250 until the QoR in step S250 satisfies all design and manufacturing requirements of the IC 100. When returning to step S200 and prior to acquiring a new graph data structure in step S200, the parameters of all Blocks 1-4 are set based on the solution obtained in step S240. Then the graph data structure acquired in step S200 will be acquired based on the newly set parameters of the IC 100.

When the QoR satisfy all design and manufacturing requirements of the IC 100, then the method continues to Step S260.

In step S260, a final design of the IC 100 is generated. The final design indicates all parameters of the blocks 101, including the internal delays 105, the external delays 104, the timing paths 106, and the physical location of the connected elements 107 of the ports 103 for the IC 100. By performing optimization of Block 1 and Block 3 together and setting the parameters of Block 3 to be identical to Block 1 during the optimization, it is ensured that Block 1 and Block 3 will be physically identical when manufactured because the physical location of the connected elements 107 of the ports is set as the same and both Block 1 and Block 3 correspond to the same design module 102 (Design Module A).

In step S260, the final design is output for manufacturing of the IC 100 based on the final design. The outputting may be performed through a variety of methods, such as transmitting to a manufacturing tool, displaying on a display screen, notifying to a user, etc.

In step S270, the IC 100 is manufactured according to the outputted final design. In the manufactured IC 100, the values of the internal delays 105, the values of the external delays 104, the timing paths 106, and the physical location of the connected elements 107 of the ports 103 of the at least two identical blocks (Block 1 and Block 3) are identical. In contrast, the blocks with identical design modules of the conventional art were physical different when manufactured due to performing time budgeting individually on all of the blocks of an IC.

Steps S200 through step S270 are merely exemplary steps of the exemplary embodiments and may include additional steps or sub-steps.

For example, after determining a set of solutions to the timing delay variables, i.e. $d_{ij}$, $e_{ij}$, these variables guide a physical implementation process. Based on the variables, an initial version of a physical database is generated. Different EDA tools may be used to check different aspects of this physical database. Then, the QoR are evaluated to determine whether the physical database satisfies all design and manufacturing requirements, including the clock cycle requirements.

With each iteration of step S200 through step S250, the values of the external delays 104 and the values of the internal delays 105 are gradually improved to consider various physical factors, until the design converges to a physical database that satisfies all requirements.

Time Budgeting Device 110

Figure 6:
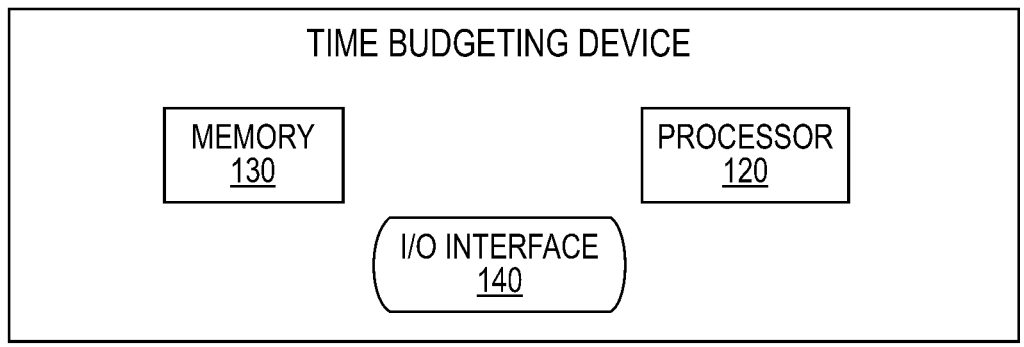
FIG. 6 illustrates a block diagram of an exemplary time budgeting device for multi-instantiation time budgeting of an IC according to an exemplary embodiment.

As shown in FIG. 6, the time budgeting device 110 may be configured as one or more computers including one or more processors 120, one or more storage devices 130, and an input/output (I/O) interface 140. The one or more processors 120 may be any type of programmed computational device, including central processing units (CPU), microprocessors, microcontrollers, networked computer systems, etc., or a specialized processor for performing integrated circuit design. The one or more storage devices 130 may be a computer readable storage medium that includes memory devices, storage media readable by a removable media drive, and/or a hard disk drive, such as random access memory (RAM), read-only memory (ROM), magnetic hard disks, optical storage discs, etc., for storing one or more software modules of instructions that control the processor 120 to perform various operations.

The I/O interface 140 allows a user to input to and receive data from the processor 120. The I/O interface 140 also allows control of the various operations performed by the processor 102. For example, the I/O interface 140 may comprise one or more input devices, such as a keyboard, a pointing device (e.g., a mouse, a track ball), a touch-sensitive display, microphone, etc. The I/O interface 140 may also comprise one or more output devices, such as a display (including a touch-sensitive display).

The one or more processors 120 and the one or more storage devices 130 of the time budgeting device 110 perform at least the same functions as the above-mentioned method. The above description of the method also applies to the following exemplary embodiments of the time budgeting device 110, which will also be discussed in detail below.

The one or more processors 120 acquire a graph data structure of an IC design for IC 100. FIG. 3 illustrates an example of the graph data structure that divides electronic components of the IC design into the plurality of blocks 101. At least two blocks 101 (e.g., Block 1 and Block 3) correspond to an identical design module 102. The graph data structure indicates an initial layout of connected elements 107 of ports 103 of each block 101, and external delays 104 and internal delays 105 for each port 103.

The one or more processors 120 acquire and initially set values of the internal delay 105 and values of the external delay 104 of the plurality of ports 103. The values of the internal delay 105 and values of the external delay 104 are periods of time delay that are caused by a data signal propagating between ports 103.

The one or more processors 120 perform optimization of the values of the internal delay 105 and the values of the external delay 104 to determine whether the parameters, such as a predetermined clock cycle, of the IC 100 is satisfied.

The blocks 101 that have the same design module 102 are set as equivalent to each other such that when optimization of the external delays 104 and the internal delays 105 is performed in step S230, as discussed herein, the time budgeting of the external delays 104 and the internal delays 105 are identical for each block 101 having the same design module 102 in the IC 100. By setting the blocks 101 having the same design module 102 as equivalent, the method implements the multi-instantiation of these blocks 101 having the same design 102 during the optimization to reduce the computational requirements of the optimization of the full IC 100 and maintains the time budgeting as identical for these blocks 101 having the same design module 102, as an improvement over the conventional techniques.

The one or more processors 120 perform optimization of the parameters, such as values of the internal delay 105 and the values of the external delay 104, to determine a solution that satisfies the requirements of the IC 100. The optimization is performed on Block 1 and Block 3 together because both Block 1 and Block 3 have the same design module 102 (Design Module A), as shown in FIG. 1. The optimization is also performed on each of Block 2 and Block 4 in addition to the optimization performed on the combination of Block 1 and Block 4.

Using the timing paths 106 in FIG. 4 as examples, assume for this example that the timing paths 106 are all under one clock cycle. The following relationships for the internal and external delays are set as requirements:

$e_{11}+d_{11} \leq$ Clock period $d_{19}+e_{19} \leq$ Clock period $d_{18}+e_{1824}+d_{24}+e_{2833}+d_{33} \leq$ Clock period $d_{38}+e_{3843}+d_{43}+e_{45} \leq$ Clock period In addition, the equivalence between the parameters of the blocks 101 of the same design module 102 is set because Block 1 and Block 3 each have the same design module 102 (Design Module A). The following equivalence requirements are set to represent the relationship between blocks of the same design module 102:

$d_{11}=d_{31}$ $d_{12}=d_{32}$ $d_{13}=d_{33}$ $d_{14}=d_{34}$ $d_{15}=d_{35}$ $d_{18}=d_{38}$ $d_{19}=d_{39}$

The one or more processors 120 obtain a solution for the time budget of all of the internal delays 105 and the external delays 104 as a result of the optimization performed on the IC 100. The solution at least indicates values of each $d_{ij}$ value and $e_i$ value that result in a time budget equal to or less than the requirements along each timing path 106. In the solution, the values of the external delays 104 and the internal delays 105 for Block 1 and Block 3 are identical due to the multi-instantiation of Block 1 and Block 3, which have the same design module 102, by setting the parameters of Block 1 and Block 3 as identical to each other and performing the optimization of Block 1 and Block 3 together in combination.

The one or more processors 120 determine QoR of the solution that indicates whether the parameters, such as the values of the internal delay 105 and the values of the external delay 104, along each timing path 106 satisfy predetermined clock cycle requirements for the IC 100.

When the QoR do not satisfy the predetermined requirements of the IC 100, then the one or more processors 120 iteratively re-perform acquiring the graph data structure, setting the parameters of Block 1 equal to Block 3, and performing optimization, obtaining a solution based on the optimization, as discussed in detail above, until the QoR satisfies the predetermined requirements of the IC 100. Prior to acquiring a new graph data structure at the start of each iteration, the parameters of all Blocks 1-4 are set based on the obtained solution of the prior iteration. Then the graph data structure acquired will be acquired based on the newly set parameters of the IC 100.

When the QoR satisfy the predetermined requirements of the IC 100, the one or more processors 120 generate a final design of the IC 100. The final design indicates all parameters of the blocks 101, including the internal delays 105, the external delays 104, the timing paths 106, and the physical location of the connected elements 107 of the ports 103 for the IC 100. By performing optimization of Block 1 and Block 3 together and setting the parameters of Block 3 to be identical to Block 1 during the optimization, it is ensured that Block 1 and Block 3 will be physically identical when manufactured because the physical location of the connected elements 107 of the ports is set as the same and both Block 1 and Block 3 correspond to the same design module 102 (Design Module A).

The one or more processors 120 output the final design for manufacturing of the IC 100 based on the final design. The outputting may be performed through a variety of manners, such as transmitting to a manufacturing tool, displaying on the I/O interface 140, etc.

The one or more processors 120 may control the manufacturing of the IC 100 according to the outputted final design. In the manufactured IC 100, the values of the internal delays 105, the values of the external delays 104, the timing paths 106, and the physical location of the connected elements 107 of the ports 103 of the at least two identical blocks (Block 1 and Block 3) are identical. In contrast, the blocks with identical design modules of the conventional art were physical different when manufactured due to performing time budgeting individually on all of the blocks of an IC.

The above-mentioned embodiments are examples of the methods and devices that achieve the improvements set forth herein. Although the above-mentioned embodiments are disclosed in relation to EDA software, these exemplary embodiments may be applied to other types of software, such as scripts.

The above-mentioned embodiments provide blocks of an IC with the same design module and perform time budgeting for the identical blocks together, which reduces computational requirements of the EDA, increases the speed and efficiency of the design process, and results in a final design of the IC chip where blocks with identical design modules have the same final time budgeted design. The same time budgeting of identical blocks also results in the same physical design of the components of the blocks when manufactured. Thus, the design process of the exemplary embodiments also changes the physical design of the blocks when the IC is manufactured to be identical, which improves the efficiency of the manufacturing process.

In conventional process, a time budget for $d_{18}$ may be "Clock period$-e_{1824}-d_{24}-e_{2833}-d_{33}$", i.e., with an output delay constraint of "$e_{1824}+d_{24}+e_{2833}+d_{33}$." While a time budget for $d_{38}$, the budget is "Clock period$-e_{3843}-d_{43}-e_{45}$", which is the output delay constraint of "$e_{3843}+d_{43}+e_{45}$." Meaning, using the conventional process the values of $d_{18}$ and $d_{38}$ are different. On the contrary, the method and device of the exemplary embodiments performs time budgeting of Block 1 and Block 3 together, which results in the values of $d_{18}$ and $d_{38}$ being identical.

Further, the using the above-mentioned example, when the exemplary embodiments calculate a time budget of "Clock period$-e_{1824}-d_{24}-e_{2833}\ d_{33}$," which is smaller than the budget of a conventional algorithm "Clock period$-e_{3843}\ d_{43}-e_{45}$," the block implementation moves the physical location of the connected elements of port $P_{38}$ of Block 3, so that the time budget can be met with a smaller value. The exemplary method and device also changes the physical location of the connected elements of port $P_{18}$ to be identical. This results in a more efficient design and optimization process that reduce the computational requirements for the optimization, and also results in manufacturing ICs where at two blocks 101 with identical design modules 102 are physically identical, contrary to the conventional art.

The invention claimed is:

1. A method of time budgeting an integrated circuit (IC), the method being performed during a time budgeting phase of designing the IC, the method comprising:
   a step one of acquiring a graph data structure of an IC design and acquiring clock cycle requirements for components of the IC design, the graph data structure including a plurality of blocks each corresponding to a design module, where at least two identical blocks of the plurality of blocks correspond to an identical design module;
   a step two of acquiring internal delay values and external delay values of a plurality of ports of each design module corresponding to the plurality of blocks;
   a step three of setting initial parameters, which include the internal delay values and the external delay values, of the at least two identical blocks as equivalent for both of the at least two identical blocks of the plurality of blocks that correspond to the identical design module;
   a step four of performing optimization of the initial parameters, including the internal delay values and the external delay values, of each of the ports of all of the plurality of blocks to result in optimized parameters, which include optimized internal delay values and optimized external delay values; and
   a step five of outputting a final design of the IC design based on results of the optimization for manufacturing of the IC based on the final design, where the optimized parameters of the at least two identical blocks of the plurality of blocks are identical.

2. The method according to claim 1, further comprising:
   a step of determining whether the optimized parameters, including the internal delay values and the external delay values, of each of the ports of all of the plurality of blocks satisfy predetermined requirements of the IC; and
   a step of, in response to determining that the predetermined requirements are not satisfied, iteratively re-performing the steps one through the step four until the predetermined requirements are satisfied.

3. The method according to claim 2, wherein, prior to re-performing the step one through the step five, setting the parameters of all of the plurality of blocks based on the optimized parameters of a prior iteration of performing the step one through the step five.

4. The method according to claim 1, further comprising a step of manufacturing the IC according to the outputted final design.

5. The method according to claim 1, further comprising a step of determining that the acquired clock cycle requirements are satisfied by:
   summing the values of the internal delay and the values of the external delay along a timing path; and
   comparing the sum to a corresponding clock period of the clock cycle requirements to determine whether the sum is less than or equal to the corresponding clock period of the clock cycle requirements.

6. The method according to claim 5, wherein the timing path is a data signal path between ports of at least two of the plurality of blocks and defines a period of time for the data signal to propagate along the corresponding data signal path.

7. The method according to claim 1, wherein the optimization is a linear optimization.

8. A time budgeting device that performs time budgeting of an integrated circuit (IC), which is performed during a time budgeting phase of designing the IC, the time budgeting device comprising:
   a memory; and
   a processor operatively coupled with the memory, the processor being programmed to perform:
      a step one of acquiring a graph data structure of an IC design and acquiring clock cycle requirements for components of the IC design, the graph data structure including a plurality of blocks each corresponding to a design module, where at least two identical blocks of the plurality of blocks correspond to an identical design module;

a step two of acquiring internal delay values and external delay values of a plurality of ports of each design module corresponding to the plurality of blocks;

a step three of setting initial parameters, which include the internal delay values and the external delay values, of the at least two identical blocks as equivalent for both of the at least two identical blocks of the plurality of blocks that correspond to the identical design module;

a step four of performing optimization of the initial parameters, including the internal delay values and the external delay values, of each of the ports of all of the plurality of blocks to result in optimized parameters, which include optimized internal delay values and optimized external delay values; and a step five of outputting a final design of the IC design based on results of the optimization for manufacturing of the IC based on the final design, where the optimized parameters of the at least two identical blocks of the plurality of blocks are identical.

9. A non-transitory computer readable storage medium storing computer-readable instructions that, when executed by a computer, cause the computer to perform time budgeting of an integrated circuit (IC), which is performed during a time budgeting phase of designing the IC, the computer performing steps comprising:

a step one of acquiring a graph data structure of an IC design and acquiring clock cycle requirements for components of the IC design, the graph data structure including a plurality of blocks each corresponding to a design module, where at least two identical blocks of the plurality of blocks correspond to an identical design module;

a step two of acquiring internal delay values and external delay values of a plurality of ports of each design module corresponding to the plurality of blocks;

a step three of setting initial parameters, which include the internal delay values and the external delay values, of the at least two identical blocks as equivalent for both of the at least two identical blocks of the plurality of blocks that correspond to the identical design module;

a step four of performing optimization of the initial parameters, including the internal delay values and the external delay values, of each of the ports of all of the plurality of blocks to result in optimized parameters, which include optimized internal delay values and optimized external delay values; and a step five of outputting a final design of the IC design based on results of the optimization for manufacturing of the IC based on the final design, where the optimized parameters of the at least two identical blocks of the plurality of blocks are identical.

* * * * *